United States Patent
Bandoh et al.

(10) Patent No.: US 6,626,236 B1
(45) Date of Patent: Sep. 30, 2003

(54) SUBSTRATE TEMPERATURE CONTROL PLATE AND SUBSTRATE TEMPERATURE CONTROL APPARATUS COMPRISING SAME

(75) Inventors: Kenichi Bandoh, Kanagawa (JP); Akihiro Ohsawa, Kanagawa (JP); Mikio Minonishi, Kanagawa (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/531,684

(22) Filed: Mar. 20, 2000

(30) Foreign Application Priority Data

Mar. 24, 1999 (JP) .......................................... 11-079215

(51) Int. Cl.$^7$ ................................................. F24F 3/00
(52) U.S. Cl. ...................... 165/206; 165/80.4; 165/64; 165/61; 118/725; 118/724; 219/444.1; 219/448.12; 392/416; 392/418
(58) Field of Search .............................. 219/444.1, 445, 219/448.12; 392/416, 418; 118/724, 725; 165/206, 80.4, 80.5, 61, 64

(56) References Cited

U.S. PATENT DOCUMENTS

| | | | | |
|---|---|---|---|---|
| 4,394,564 A | * | 7/1983 | Dills | |
| 4,503,335 A | * | 3/1985 | Takahashi | |
| 5,001,423 A | * | 3/1991 | Abrami et al. | 219/483 |
| 5,059,770 A | * | 10/1991 | Mahawili | 219/444.1 |
| H1145 H | * | 3/1993 | Anderson | 118/725 |
| 5,294,778 A | * | 3/1994 | Carman et al. | 219/385 |
| 5,595,241 A | * | 1/1997 | Jelinek | 165/80.4 |
| 5,635,093 A | * | 6/1997 | Arena et al. | 219/444 |
| 5,700,992 A | * | 12/1997 | Honda et al. | 219/444.1 |
| 5,775,416 A | * | 7/1998 | Heimanson et al. | 118/725 |
| 5,802,856 A | * | 9/1998 | Schaper et al. | 165/206 |
| 5,846,375 A | * | 12/1998 | Gilchrist et al. | 165/80.4 |
| 5,966,940 A | * | 10/1999 | Gower et al. | 62/3.7 |
| 6,018,616 A | * | 1/2000 | Schaper | 118/724 |
| 6,054,688 A | * | 4/2000 | Moschini | 118/725 |
| 6,098,408 A | * | 8/2000 | Levinson et al. | 62/3.7 |
| 6,225,601 B1 | * | 5/2001 | Beer et al. | 118/725 |
| 6,359,264 B1 | * | 3/2002 | Schaper et al. | 219/444.1 |
| 6,469,283 B1 | * | 10/2002 | Burkhart et al. | 219/444.1 |

FOREIGN PATENT DOCUMENTS

| | | | | |
|---|---|---|---|---|
| EP | 0320297 | * | 6/1989 | |
| EP | 0418541 | * | 3/1991 | |
| JP | 63-216283 | | 8/1988 | |
| JP | 0027715 | * | 1/1990 | ... 118/724 |
| JP | 0220718 | * | 9/1991 | ... 118/724 |
| JP | 7-58025 | * | 3/1995 | |
| JP | 7-260648 | * | 10/1995 | |
| JP | 10-107018 | * | 4/1998 | |
| JP | 10-256325 | * | 9/1998 | |
| JP | 11-67619 | * | 3/1999 | |
| WO | WO 98/05060 | | 2/1998 | |

* cited by examiner

Primary Examiner—John K. Ford
(74) Attorney, Agent, or Firm—Armstrong, Westerman & Hattori, LLP

(57) ABSTRACT

Object of the present invention is to provide uniform heat distribution to a substrate undergoing heat treatment on top of a heat exchange plate. A heat exchange plate 1 is a flat, circular receptacle, has a cooling liquid inflow opening 11 on one end and outflow opening 13 on the other end, and cooling liquid flows on the inside. The surface of the plate 1 is divided, for example, into four zones having different heat capacities and heat transfer characteristics, and an independently controllable foil heater 21A, 23A, 25A, 27A is attached to each zone. Heater 21A covers a zone, which circumferentially surrounds a substrate placed on top of a plate, heater 23A covers a zone directly beneath a substrate, heater 25A covers a zone of the vicinity of the outflow opening 13, and heater 27A covers a zone of the vicinity of the inflow opening 11. Temperature sensors 31–33 are disposed on the inside of a plate at four locations of a second zone, which are apt to receive the affects of the first to fourth zones. Based on each plate temperature detected by the temperature sensors 31 to 33, a temperature of the substrate at a location corresponding thereto is estimated.

7 Claims, 4 Drawing Sheets

SUBSTRATE TEMPERATURE CONTROL PLATE AND SUBSTRATE TEMPERATURE CONTROL APPARATUS COMPRISING SAME

BACKGROUND OF THE INVENTION

1. Field of the Invention

The present invention relates to technology for controlling the temperature of a substrate to a desired temperature in a heat exchange plate, which either heats or cools a substrate, like a semiconductor wafer heating/cooling plate in a semiconductor manufacturing apparatus.

2. Description of the Related Art

For example, in order to heat or cool a semiconductor wafer in a semiconductor manufacturing apparatus, there is generally employed a system, wherein separate heat exchange plates are provided for heating and cooling, and a wafer is transported therebetween by a robot. Each heat exchange plate used in this type of system has a large heat capacity with little temperature fluctuation, and static temperature control is performed such that the temperature of each plate is maintained constant.

Conversely, there is also a system, which furnishes both heating and cooling functions in a single heat exchange plate. In such system, it is required to use a high response plate with a small heat capacity, and to dynamically control the operation thereof from a low temperature state to a high temperature state, and vice versa. A heat exchange plate is generally a circular flat-shaped receptacle having a cavity, within which a heating medium flows. A wafer is placed on the upper surface thereof, and the temperature of the wafer is controlled by the heating medium fluid flowing inside the heat exchange plate. Further, there is also a system, wherein foil heaters (heat wire heaters wired in a foil-shaped pattern) for heating a wafer are applied on the top and bottom surfaces of a heat exchange plate.

In the latter system, high-speed, high precision temperature control performance is required to enhance product yield while achieving high throughput. To completely satisfy this requirement, improvements will most likely be needed in a variety of aspects, such as control method, and plate structure, and one important aspect thereof is to keep the temperature distribution on the surface of the wafer extremely small.

However, for the above-mentioned heat exchange plate, since, on the plate surface, an approximately central zone, on which a wafer is placed, and a peripheral zone thereto differ in the heat capacity and in the heat transfer characteristic, there occur temperature distribution irregularities in a concentric ring shape in the wafer as well. Further, an inlet/outlet of the above-mentioned heating medium fluid is provided in this plate, and the zone related thereto has a heat capacity and heat transfer characteristics different from those of the above 2 zones. This is also another reason to cause wafer temperature distribution irregularities.

A heat exchange plate of an International Publication No. WO98/05060 that is supposed to solve for these problems is constituted such that the plate surface is divided into the above-mentioned 3 zones which have different heat capacities and different heat transfer characteristics from one another, that is, an approximately central zone, a peripheral zone thereto, and a fluid inlet/outlet zone, and independent electric circuit foil heaters are attached thereto, respectively, so that temperature control is performed independently.

However, there are a number of problems with this heat exchange plate, too. The first is that the leads of the foil heaters come beneath a placed wafer. A lead portion, unlike a heat generating portion of a foil heater, has temperature differences in itself, which causes temperature distribution to also occur in a wafer. The second is that a fluid inlet and outlet differ greatly in the heat transfer characteristic. The third problem arises from the fact that a temperature sensor is disposed in each zone, and temperature is controlled in each zone. For example, when a certain zone is away from a wafer, even if the temperature of that zone is controlled to the same temperature as the other zones, it is not possible to guarantee that wafer temperature distribution will be uniform. There are cases in which a wafer does not achieve a target temperature, unless the temperature in the vicinity of the above-mentioned fluid inlet/outlet in particular is made either a higher temperature or a lower temperature than the wafer target temperature.

SUMMARY OF THE INVENTION

Consequently, an object of the present invention is to solve the above-mentioned problems, and to make uniform the temperature distribution of a substrate that is undergoing heat treatment on top of a heat exchange plate.

A substrate temperature control plate according to the present invention comprises a plurality of zones obtained by partitioning this substrate temperature control plate, temperature sensors, which are directly under a substrate, and are respectively disposed in locations that receive the respective affects of the plurality of zones so as to detect the temperatures of the locations thereof, and heaters, which perform temperature control independently for the respective plurality of zones.

Each of the temperature sensors detects the temperature of the location beneath a substrate where the sensor itself is disposed, and the heaters independently control the respective plurality of zones in accordance with each detected temperature. According to this constitution, the detected temperatures of a plurality of temperature sensors reflect the temperatures of corresponding locations of a substrate. Therefore, by controlling on the basis of these detected temperatures the zonal heaters that have an affect on these temperatures, it is possible to evenly control the temperatures of a plurality of locations of a substrate, that is, to favorably and uniformly control the temperature of an entire substrate.

In a preferred aspect of the embodiment, the constitution is made such a plurality of zones are segmented into portions which differ either in the heat capacity or in the heat transfer characteristic.

For example, when a substrate temperature control plate related to this aspect of the embodiment has a cavity on the inside through which passes a heating medium fluid for controlling the temperature of a substrate, and comprises an inlet for supplying a heating medium fluid to the cavity, and an outlet for discharging a heating medium fluid from the cavity, the abovementioned plurality of zones are a first zone, which is in a location, which surrounds a substrate on the outside of the outer circumference of a substrate, a second zone which is located directly beneath a substrate, a third zone of the vicinity of the outlet, and a fourth zone of the vicinity of the inlet. Since these four zones are portions which are largely different from one another in the heat capacity or in the heat transfer characteristic, it is very effective to segment into and independently control the temperature of these zones from the standpoint of making the temperature of an entire substrate uniform.

In a preferred aspect of the embodiment, heaters are bonded to the top surface and bottom surface of a substrate temperature control plate so as to be mutually symmetrical, so that this substrate temperature control plate becomes substantially vertically symmetrical over its entirety. For example, when a substrate temperature control plate comprises a first, second, third, and fourth zones as described hereinabove, a substrate temperature control plate related to this aspect of the embodiment has a first, second, third, and fourth heater corresponding to the above-mentioned first, second, third, and fourth zones, respectively, and these heaters are bonded to the top surface and bottom surface of the substrate temperature control plate so as to be vertically symmetrical. With a constitution such as this, a temperature difference between the top surface and the bottom surface of a plate can be substantially eliminated, and thermal deformation of a plate occurring in accordance with this temperature difference can be suppressed.

In a preferred aspect of the embodiment, first, second, third, and fourth temperature sensors are disposed in said second zone, the first temperature sensor is disposed in a location of the second zone that is close to the first zone, the second temperature sensor is disposed in a location approximately central location of the second zone, the third temperature sensor is disposed in a location of the second zone that is close to the third zone, and the fourth temperature sensor is disposed in a location of the second zone that is close the fourth zone.

In a preferred aspect of the embodiment, irregularities of temperature distribution in an entire plate caused by leads of a heater of a certain zone are compensated for by a heater of another zone. Thereby, the temperature of an entire substrate can be made more favorable and uniform.

A substrate temperature control plate according to the present invention is provided, for example, in a substrate temperature control apparatus as follows. This substrate temperature control apparatus comprises said substrate temperature control plate, a temperature determining device, and temperature controlling means. The temperature determining device determines a respective target temperature of each of said plurality of zones based on a temperature detected by said temperature sensor. The temperature controlling means performs temperature control such that a respective target temperature that the temperature determining device has determined is established in each of the plurality of zones.

DESCRIPTION OF THE PREFERRED EMBODIMENTS

Figure 1:
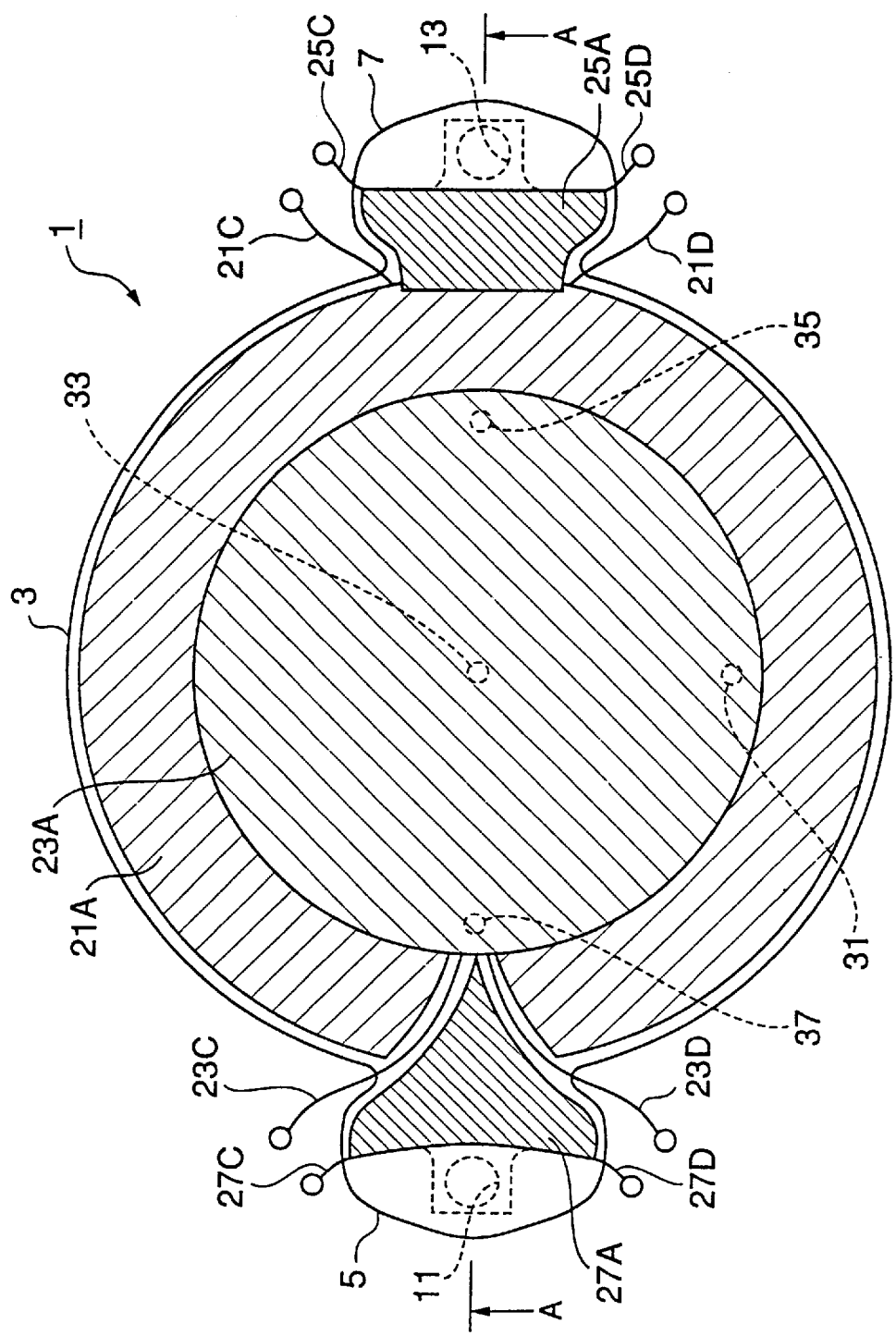
FIG. 1 is a plan view of a heat exchange plate utilized in a photoresist process of a semiconductor wafer related to an aspect of the embodiment of the present invention.
Figure 2:
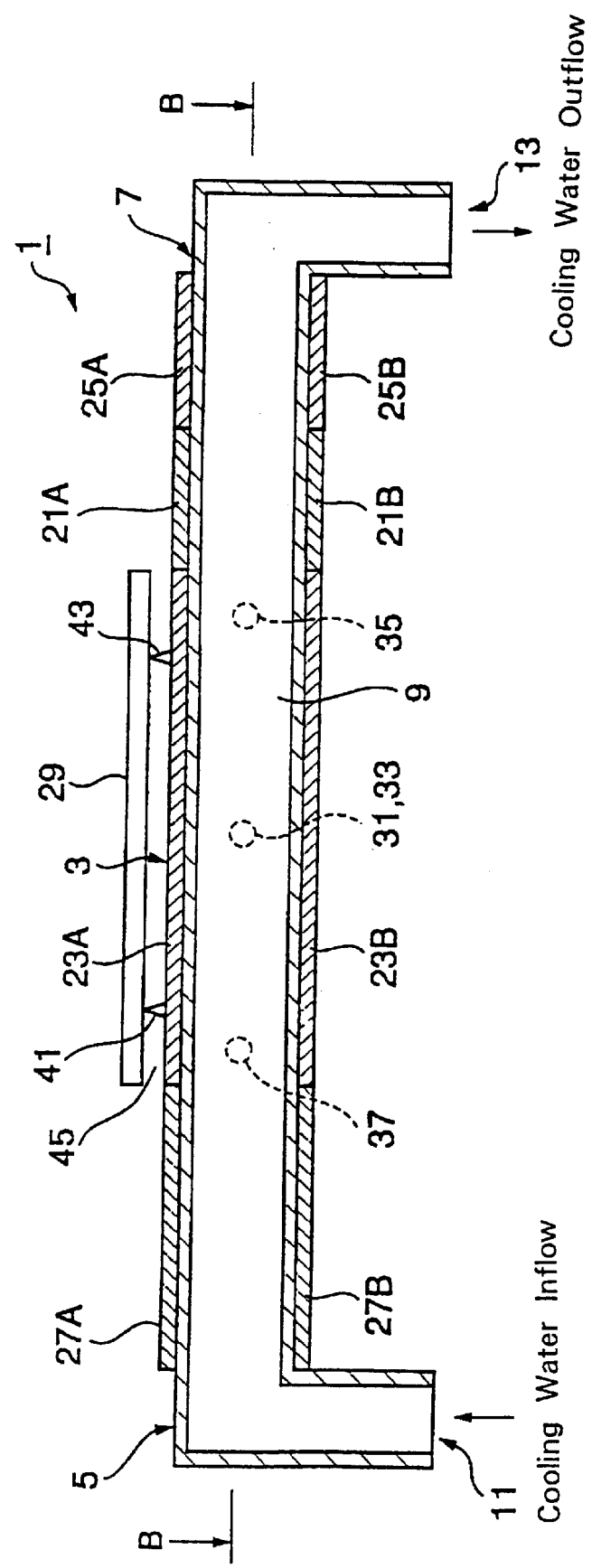
FIG. 2 is a cross-sectional view along line A—A of FIG. 1 of a heat exchange plate.
Figure 3:
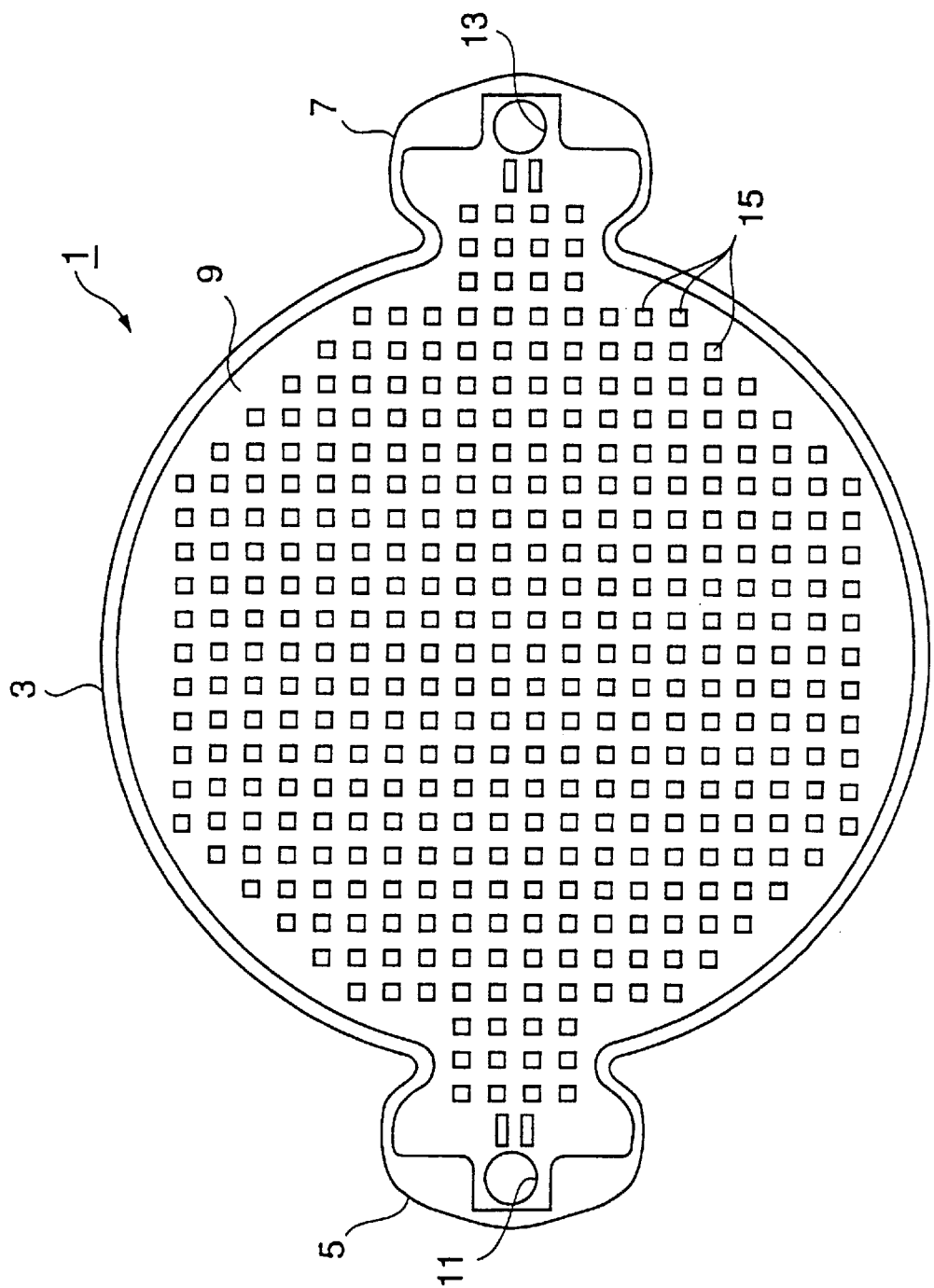
FIG. 3 is a cross-sectional view along line B—B of FIG. 2 of a heat exchange plate.

FIG. 1 is a plan view of a heat exchange plate used in a photoresist process of a semiconductor wafer related to an aspect of the embodiment of the present invention. FIG. 2 is a cross-sectional view along line A—A of FIG. 1 of this heat exchange plate, and FIG. 3 is a cross-sectional view along line B—B of FIG. 2 of this heat exchange plate.

As shown in these figures, a heat exchange plate 1 comprises a plate body 3, which is a circular flat-shaped receptacle on top of which is placed a wafer 29, and an inlet portion 5 and an outlet portion 7, which are auriculate flat-shaped receptacles projecting outwards from outer circumference locations on the right and left of this plate body 3. The inlet portion 5 and outlet portion 7 are disposed at locations on opposite (symmetrical) sides facing each other across the center of a plate body 3. Accordingly, the flat shape of the heat exchange plate 1 is symmetrically balanced. As shown in FIG. 2, a semiconductor wafer 29 is placed on top of a plurality of small bosses 41, 43, which are formed on the top surface of the plate body 3. The bottom surface of a semiconductor wafer 29 does not come in direct contact with the top surface of the plate body 3, creating an extremely narrow air proximity gap 45 therebetween. As shown in FIGS. 2 and 3, a cavity 9, through which a cooling liquid passes, is formed on the inside of this heat exchange plate 1, and this cavity 9 begins from the inlet portion 5, spreads out over the entire area of the plate body 3, and then terminates at the outlet portion 7. An inflow opening 11, which allows cooling liquid to flow into the cavity 9, is formed in the bottom wall of the inlet portion 5, and an outflow opening 13, which allows cooling liquid to flow out from the cavity 9, is formed in the bottom wall of the outlet portion 7. Throughout the inside of the cavity 9, a plurality of either columnar or pin-shaped ribs (or fins) 15 are erected, connecting the bottom wall and the top wall of the cavity 9. These ribs 15 increase the strength of a plate 1, prevent bulging of a plate 1 due to cooling liquid pressure, and contribute toward making temperature distribution uniform by disturbing the flow of the cooling liquid, and enhancing heat exchange efficiency between the cooling liquid and the plate 1.

As shown in FIG. 1, foil heaters (heat wire heaters which are wired in a foil-shaped pattern) 21A, 23A, 25A, 27A are bonded to the top surface of a heat exchange plate 1. As a comparison of FIG. 1 and FIG. 3 indicates, the foil heaters 21A, 23A, 25A, 27A completely cover the area in which the cavity 9 exists. As can be seen from FIG. 2, foil heaters 21B, 23B, 25B, 27B of approximately the same shape as the foil heaters 21A, 23A, 25A, 27A of the top surface of the heat exchange plate 1 are bonded to approximately the same locations on the bottom surface of the heat exchange plate 1 as well, such that these top surface foil heaters 21A, 23A, 25A, 27A, and bottom surface foil heaters 21B, 23B, 25B, 27B form a vertically symmetrical heating balance in this heat exchange plate 1. In this manner, a heat exchange plate 1 has a substantially vertically symmetrical constitution.

As shown in FIG. 1, the top surface of a heat exchange plate 1 is divided, for example, into four zones which differ in the heat capacity and in the heat transfer characteristic from one another, and these zones are covered by foil heaters 21A, 23A, 25A, 27A, respectively, which are mutually independent electrical circuits. The zone covered by a first foil heater 21A is a donut-shaped zone of the top surface of a plate body 3, located on the outer side of the outer circumference of a semiconductor wafer 29 placed on top of the plate. This is called the "first zone". The zone covered by a second foil heater 23A is a circular-shaped zone of the top surface of a plate body 3, located directly beneath a semiconductor wafer 29 placed on top of the plate. This is called the "second zone". The first and second zones are arranged concentrically. The zone covered by a third foil heater 25A is a zone covering the area of outlet portion 7, through which a cooling liquid passes. This is called the "third zone". The zone covered by a fourth foil heater 27A is a zone covering the area of inlet portion 5, through which a cooling liquid passes. This is called the "fourth zone". Each foil heater 21A, 23A, 25A, 27A has a lead 21C, 21D, 23C, 23D, 25C, 25D, 27C, 27D, respectively, protruding outwards from the foil heater for connecting the same to a respective power circuit (Refer to No. 57 of FIG. 4). The bottom surface of the plate 1 is constructed in the same manner as the above-mentioned top surface (hereinafter, only the top surface will be explained, and an explanation of the bottom surface will be omitted).

In this manner, the top surface of a heat exchange plate 1 is divided into four zones, and each zone is constituted such that respective temperatures can be controlled independently in accordance with respective independently controllable heaters. This is a constitution based on a concept, which, when either non-uniform heat capacity or heat transfer characteristic exist in a plate, calls for independently controlling the temperature of various portions which are mutually different either in the heat capacity or in the heat transfer characteristic. In other words, in this aspect of the embodiment, a heat exchange plate 1 is divided into four portions which differ either in the heat capacity or in the heat transfer characteristic, these being a portion of a plate body 3 of the outer side of a wafer, that is, a donut-shaped portion (first zone) surrounding a second zone, a portion that is located directly beneath a wafer of a plate body 3, that is, a circular portion (second zone), which faces the bottom surface of a wafer 29 by way of an air proximity gap 45, a portion (third zone) in the vicinity of the cooling liquid outflow opening, that is, the outlet portion 7, and a portion (fourth zone) in the vicinity of the cooling liquid inflow opening, that is, the inlet portion 5, and temperature control can be performed independently for the respective portions.

Furthermore, of the leads of the foil heaters of the four zones, only the leads of the second foil heater 23A cut across another zone, but the leads of the foil heaters of the other zones do not cut across another zone. Now, the leads 23C, 23D of the second foil heater 23A, which is in charge of the second zone, extend toward the outside by cutting across the first zone at a location nearest to the inlet portion 5. Then, the fourth foil heater 27A, with the object of not only compensating the temperature of the inlet portion 5, that is, the fourth zone, but also compensating the temperature of the location through which the leads 23C, 23D from the second zone pass, extends in a triangular shape from the inlet portion 5 along the leads 23C, 23D so as to penetrate the first zone and reach to the outer circumference of the second zone. The second zone, which is located directly beneath a wafer, is completely covered by the second foil heater 23A, and none of the leads of any of the foil heaters passes therethrough.

A plurality of contact-type temperature sensors 31, 33, 35, 37 are disposed inside a plate body 3. Each of the temperature sensors 31, 33, 35, 37 is, for example, a thermo-sensitive resistor element, and is embedded, for example, inside one of the columnar ribs 15 inside the cavity 9. These temperature sensors 31, 33, 35, 37 are all disposed in the second zone, that is, in locations directly beneath a semiconductor wafer 29, or to put it another way, in a portion of a plate body 3 that face toward a wafer 29 by way of an air proximity cavity 45 (portion that is substantially directly involved in the temperature control of a wafer 29). And each of the temperature sensors 31, 33, 35, 37 is disposed, respectively, within the second zone in a place, in which the affects of the temperature of each of the first-fourth zones is substantially most favorably (or relatively favorably) manifested, in other words, in a place in which the temperature of each of the first-fourth zones substantially most favorably (or relatively favorably) affects the temperature of a semiconductor wafer 29. That is, a first temperature sensor 31 is disposed in a place in which the temperature of the first zone substantially most favorably (or relatively favorably) affects the wafer temperature, that is, in a place in the second zone that is close to the first zone (or in a place that is closer to the first zone than to the thermal center or geometrical center of the second zone). A second temperature sensor 33 is disposed in a place in which the temperature of the second zone substantially most favorably (or relatively favorably) affects the wafer temperature, in other words, in a place in which the affect of temperatures of zones other than the second zone is least likely to be manifested, that is, either in the thermal center or the geometrical center of the second zone, or in the vicinity of these centers. A third temperature sensor 35 is disposed in a place in which the temperature of the third zone (the outlet portion 7) substantially most favorably (or relatively favorably) affects the wafer temperature, in other words, in a place in the second zone that is close to the third zone (or in a place that is closer to the third zone than to either the thermal center or geometrical center of the second zone). A fourth temperature sensor 37 is disposed in a place in which the affects of the temperature of the fourth zone (the inlet portion 5) is substantially most favorably (or relatively favorably) manifested in the wafer temperature, in other words, in a place in the second zone that is close to the fourth zone (or in a place that is closer to the fourth zone than to either the thermal center or geometrical center of the second zone). In this manner, an individual temperature sensor is provided corresponding to each of the first-fourth zones. Furthermore, in this aspect of the embodiment, there is provided one temperature sensor corresponding to one zone, but there can also be provided two or more temperature sensors corresponding to one zone.

The above-described heat exchange plate 1 comprises a fluid inlet and outlet in separate places as independent zones, and independently controls the temperature of four zones having different heat capacities and heat transfer characteristics consisting of the inlet and outlet zones, a zone directly beneath a wafer, and a zone that surrounds a wafer. Further, temperature sensors 31, 33, 35, 37 related to each of the four zones are all provided in the second zone, that is, in locations directly beneath a semiconductor wafer 29. With these temperature sensors 31, 33, 35, 37, it is possible to control the foil heaters of the four zones such that the temperature of the second zone becomes uniform. With these features, the temperature distribution of a wafer can be made uniform with high accuracy and reliability. Further, the fourth foil heater 27A compensates the temperature of a place, through which pass leads 23C, 23D that are located adjacent to a semiconductor wafer 29. For this reason, it is possible to reliably suppress the variations in wafer temperature distribution, which are apt to be caused by leads.

When a heat exchange plate 1 of a constitution such as this is used for controlling the temperature of a semiconductor wafer 29 placed thereupon, in the case of cooling, basically, the temperature of the semiconductor wafer 29 is controlled to a target temperature by supplying cooling liquid into the plate 1, which has been set to a temperature lower than a cooling target temperature, and applying heat via foil heaters 21A, 23A, 25A, 27A, 21B, 23B, 25B, 27B. At this time, the wafer temperature at each place is estimated in accordance with calculations based on the plate temperatures at each place, which are detected, respectively, by temperature sensors 31–37 embedded inside the plate 1, and the supply of power to each foil heater 21A, 23A, 25A, 27A, 21B, 23B, 25B, 27B in charge of zones corresponding to each place is adjusted so that the estimated wafer temperature at each of these places is identical to the target temperature.

Figure 4:
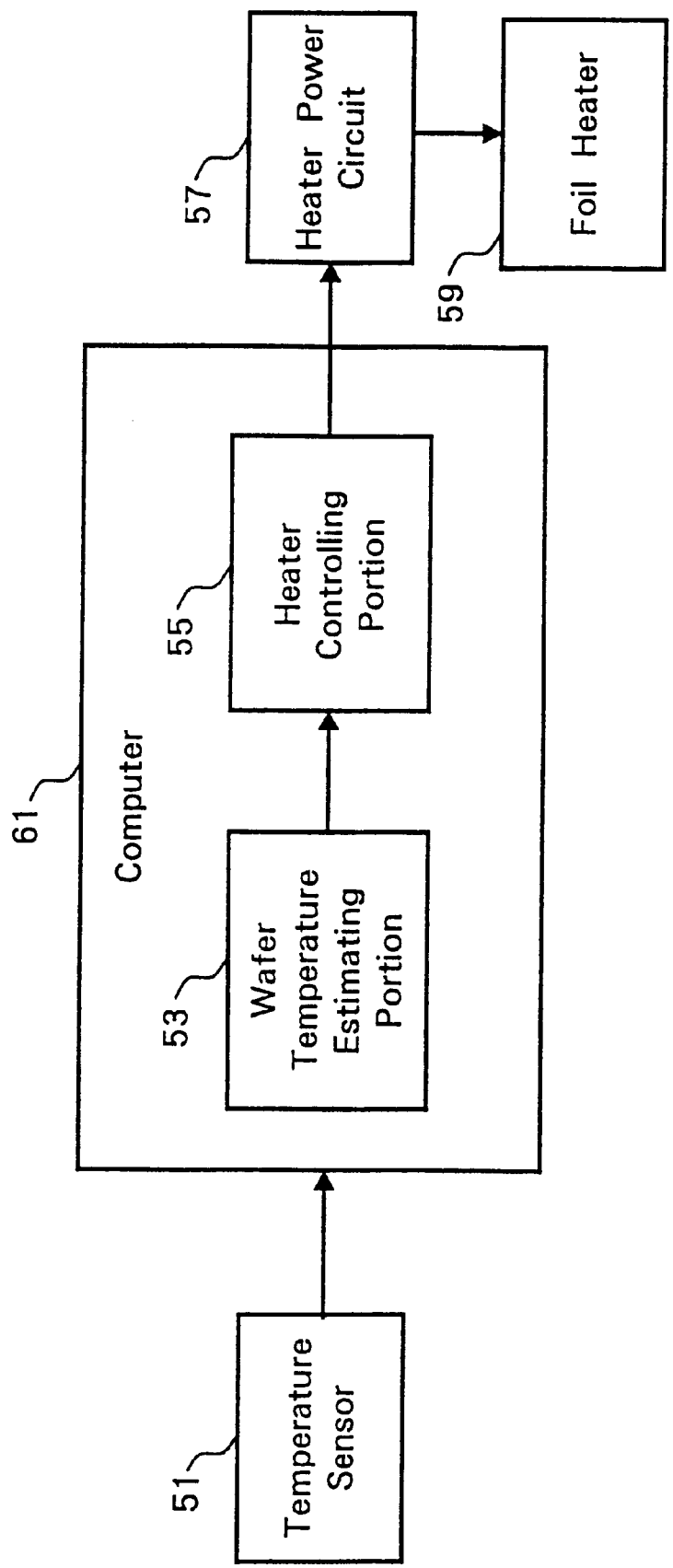
FIG. 4 is a block diagram showing a portion corresponding to a first zone of a control system.

FIG. 4 shows the constitution of a control system for performing this kind of control. Furthermore, FIG. 4 only shows portions corresponding to one zone in the control system.

As shown in FIG. 4, a wafer temperature estimating portion 53 captures the output signal of a temperature sensor 51 corresponding to one certain zone (for example, temperature sensor 31 for the first zone) in a prescribed sufficiently short sampling interval, and determines the plate temperature of each time. The wafer temperature estimating portion 53 estimates the current wafer temperature by calculations based on plate temperatures from the past to the present. The wafer temperature estimating portion 53 repeats this estimating operation at the above-mentioned sampling interval. A heater controlling portion 55 captures the current wafer temperature estimated by the wafer temperature estimating portion 53, and outputs to a heater power circuit 57 an operating signal for operating the output power thereof so that the current wafer temperature becomes the target temperature. The heater controlling portion 55 repeats this operation at the above-mentioned sampling interval. The heater power circuit 57 supplies power controlled in accordance with an operating signal from the heater controlling portion 55 to the foil heater 59 in charge of the relevant zone (for example, in the case of the first zone, to the foil heaters 21A, 21B of the top surface and bottom surface of the first zone).

The wafer temperature estimating portion 53 and the heater controlling portion 55, respectively, may be realized as tasks of a computer 61, or may also be realized via dedicated hardware circuits. Because there are four zones as explained above in a heat exchange plate 1, four of the control systems shown in FIG. 4 exist in parallel. The wafer temperature estimating portions 53 and heater controlling portions 55 of these four control systems may either be realized in accordance with multitask processing by one computer 61, or may be realized by either individual processing or distributed processing by separate computers, or may be realized as separate dedicated hardware circuits, or may be realized by a combination thereof.

The wafer temperature estimating portion 53 estimates wafer temperature from temperature sensor-detected plate temperatures using a state space model of plate temperature (input) and wafer temperature (output). This state space model is prepared in accordance with a system identification theory based on the results of actual measurements of the plate temperatures of a heat exchange plate 1 and wafer temperatures taken beforehand in the design stage. This state space model is expressed, for example, as the set of formulas of hereinbelow.

$$x(t+1) = A \cdot x(t) + B \cdot u(t) + K \cdot e(t) \tag{1}$$

$$y(t) = C \cdot x(t) + D \cdot u(t) + e(t) \tag{2}$$

$$A = \begin{pmatrix} a11 & a12 & a13 & a14 & a15 \\ a21 & a22 & a23 & a24 & a25 \\ a31 & a32 & a33 & a34 & a35 \\ a41 & a42 & a43 & a44 & a45 \\ a51 & a52 & a53 & a54 & a55 \end{pmatrix} \tag{3}$$

$$B = [b1 \ b2 \ b3 \ b4 \ b5]T \tag{4}$$

$$C = [c1 \ c2 \ c3 \ c4 \ c5] \tag{5}$$

$$D = d \tag{6}$$

$$K = [k1 \ k2 \ k3 \ k4 \ k5]T \tag{7}$$

Here, t is the sampling time, and t+1 is a subsequent sampling time. u(t) is plate temperature, and y(t) is wafer temperature. Further, e(t) is a determinant of wafer temperature, which is attributed primarily to fluctuations of the air proximity gap 45 (Refer to FIG. 2) of between a wafer 29 and a plate 1. Further, x(t) is a state variable. A, B, C, D are coefficients (scalar, vector, or tensor) determined based on the abovementioned results of actual measurements.

As shown in Formula (1) above, the state variable x (t+1) of each time is defined as a function (for example, a linear function) of the state variable x(t) of the previous time, a plate temperature u(t), and an air proximity gap factor e(t). As shown in Formula 2 above, the wafer temperature y(t) of each time is defined as a function (for example, a linear function) of the state variable x(t) of the same time, a plate temperature u(t), and an air proximity gap factor e(t). Furthermore, the value d of coefficient D can be set to 0 (That is, the wafer temperature y(t) of each time can be defined such that it is affected by a past plate temperature, but is not affected by a plate temperature u(t) of the same time.).

Furthermore, the above-mentioned air proximity gap factor e(t) is an element, which substantially randomly fluctuates non-linearly in accordance with thermal deformation of a wafer 29 and a plate 1 during heat treatment, and the raising and lowering of a wafer 29 before and after heat treatment, and, after constructing a provisional model by determining coefficients such as A, B, C, D from the above-mentioned results of actual measurements, this air proximity gap factor e(t) is calculated from an error between a wafer temperature estimated using this provisional model, and the results of an actual measurement of a wafer temperature. Accordingly, in this air proximity gap factor e(t), there is included not only fluctuations of an air proximity gap 45, but also all kinds of substantially randomly fluctuating elements. This air proximity gap factor e(t) is substantially white noise.

According to the simulations of the inventors, conformance was best when the state space model was a 5 fifth order model as in the above example. The wafer temperature estimating portion 53 can perform calculations using a fourth-order Runge-Kutta method.

By using the above-mentioned state space model, it is possible to accurately estimate a wafer temperature. Further, this model takes into consideration the air proximity gap 45 and other such substantially random fluctuating elements, that is, white noise elements, which also contributes toward enhancing estimation accuracy. By using the temperature of each portion of a is wafer, which is highly accurately estimated in this manner, and independently controlling the temperature of plate portions (zones), which exert an influence on the temperature of each portion of this wafer, it becomes possible to precisely control an entire wafer to a target temperature.

An aspect of the embodiment of the present invention has been explained hereinabove, but the above-described aspect of the embodiment is strictly an example for explaining the present invention, and does not purport to limit the present invention only to the above-described aspect of the embodiment. Therefore, the present invention can also be implemented in a variety of aspects other than the above-described aspect of the embodiment. For example, the fluid inlet and outlet can be disposed in adjacent places. The plate surface can also be subdivided into more numerous zones than four zones, more numerous temperature sensors can be provided in accordance therewith, and wafer temperature distribution can be made more exactly uniform. When wafer temperature is estimated from plate temperature, it is not absolutely necessary to use a state space model defined by the above-mentioned set of formulas. A state space model defined by a different set of formulas can also be used, such as a state space model, which, for example, makes u(t) a vector comprising plate temperature, foil heater power operation quantity (equivalent to dynamic strain during heating), and the number of steps of a stepping motor for raising and lowering a wafer as elements, and makes e(t) the remaining noise. In addition, the present invention can also be constituted such that wafer temperature is estimated from plate temperature without a state space model, by using, for example, either relational expression between a plate temperature and a wafer temperature which is computed from statistical data, a table which relates variable plate temperatures to corresponding wafer temperatures, or theoretical relational expression between a plate temperature and a wafer temperature which is computed in accordance with theoretical analysis.

What is claimed is:

1. A substrate temperature control plate for controlling the temperature of a substrate placed on the top surface, comprising:

a plurality of zones obtained by partitioning said substrate temperature control plate, said control plate being arranged for disposing said substrate above solely one of said plurality of zones;

a plurality of temperature sensors disposed in said solely one zone directly beneath said substrate, in locations which receive the effects of said plurality of zones, respectively, for detecting temperatures of said locations; and heaters for independently controlling the temperatures of said plurality of zones.

2. The substrate temperature control plate according to claim 1, wherein said plurality of zones are constituted by partitioning said substrate temperature control plate into portions which are different either in the heat capacity or the heat transfer characteristics.

3. The substrate temperature control plate according to claim 1, wherein said heaters are bonded to the top surface and bottom surface of said substrate temperature control plate so as to be mutually symmetrical, so that said substrate temperature control plate has a substantially vertically symmetrical thermal structure.

4. A substrate temperature control plate according to claim 1 having on the inside a cavity which spreads out over the plurality of heating zones and through which passes a heating medium fluid for controlling the temperature of a substrate, said plate comprising an inlet for supplying said heating medium fluid to said cavity, and an outlet for discharging said heating medium fluid from said cavity, wherein said plurality of zones are a first zone located on an outer area surrounding the circumference of said substrate, a second zone located directly beneath said substrate, a third zone located in the vicinity of said outlet, and a fourth zone located in the vicinity of said inlet.

5. The substrate temperature control plate according to claim 4, wherein said first, second, third, and fourth temperature sensors are disposed in said second zone; said first temperature sensor is disposed in a location in said second zone that is close to said first zone, said second temperature sensor is disposed in an approximately central location of said second zone, said third temperature sensor is disposed in a location in said second zone that is close to said third zone, and said fourth temperature sensor is disposed in a location in said second zone that is close to said fourth zone.

6. The substrate temperature control plate according to claim 4, wherein said inlet and said outlet are provided in symmetrical locations such that they face each other across the plate.

7. A substrate temperature control apparatus, comprising:

a substrate temperature control plate for controlling the temperature of a substrate placed on the top surface thereof, a temperature determining device, and a temperature controlling means, wherein said substrate temperature control plate comprises a plurality of zones obtained by partitioning said substrate temperature control plate, said control plate being arranged for disposing said substrate above solely one of said plurality of zones; a plurality of temperature sensors which are disposed directly beneath said substrate in said solely one zone, in locations which receive effects of said plurality of zones, respectively, for detecting the temperature of said locations; and heaters for independently controlling the temperatures of said plurality of zones; and said temperature determining device determines target temperatures of said plurality of zones based on temperatures detected by said temperature sensors, and said temperature controlling means performs temperature control such that said target temperatures determined by said temperature determining device are established in said plurality of zones.

* * * * *